(12) United States Patent
Yamaki et al.

(10) Patent No.: US 7,999,715 B2
(45) Date of Patent: Aug. 16, 2011

(54) INTERFERENCE REDUCTION DEVICE

(75) Inventors: Ryo Yamaki, Kanagawa-ken (JP); Toshiyuki Yamagishi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/716,815

(22) Filed: Mar. 3, 2010

(65) Prior Publication Data

US 2010/0295716 A1     Nov. 25, 2010

(30) Foreign Application Priority Data

May 19, 2009     (JP) ................. 2009-121162

(51) Int. Cl.
*H03M 1/12*     (2006.01)

(52) U.S. Cl. ...................... 341/155; 341/122

(58) Field of Classification Search .......... 341/117–120, 341/122, 143, 155
See application file for complete search history.

(56) References Cited

U.S. PATENT DOCUMENTS

| 5,457,456 A | * | 10/1995 | Norsworthy | 341/61 |
| 5,548,286 A | * | 8/1996 | Craven | 341/126 |
| 5,648,777 A | * | 7/1997 | Bays et al. | 341/110 |
| 2008/0191913 A1 | * | 8/2008 | Komatsu et al. | 341/122 |

FOREIGN PATENT DOCUMENTS

| JP | 06252979 | 9/1994 |
| JP | 09153802 | 6/1997 |
| JP | 2001053609 | 2/2001 |

* cited by examiner

*Primary Examiner* — Jean B Jeanglaude
(74) *Attorney, Agent, or Firm* — Turocy & Watson, LLP

(57) ABSTRACT

An interference reduction device includes an analog to digital converter, a serial to parallel converter, a first FIR filter, a second FIR filters, a flip-flop, a decision unit, and a selector. The analog to digital converter performs A/D conversion. The serial to parallel converter performs a session of distribution processing in which a digital signal obtained by the A/D conversion. The first FIR outputs the signal after a filter operation at the desired output frequency. The second FIR filters each perform a filter operation, also each output the generated signals at the desired output frequency. The flip-flop samples the inputted digital signal. The decision unit decides which one of the FIR filters has the smallest influence of interference of the input digital signal. The selector outputs one of the signals outputted by the FIR filters.

16 Claims, 15 Drawing Sheets

INTERFERENCE REDUCTION DEVICE

CROSS REFERENCE TO RELATED APPLICATION

This application is based upon and claims the benefit of priority from the prior Japanese Patent Application No.P2009-121162, filed on May 19, 2009, the entire contents of which are incorporated herein by reference.

FIELD OF THE INVENTION

The present invention relates to an interference reduction device to reduce interference with an analog signal from a digital signal.

DESCRIPTION OF THE BACKGROUND

Heretofore, a communication apparatus has the following problem in digital modulation if an analog signal line and an asynchronous digital signal line are arranged close to each other in the communication apparatus. More specifically, such close arrangement allows toggles in the digital signal to interfere with the analog signal, and thereby sharp peaks sometimes appear in the analog signal. When the analog signal thus influenced by the interference is sampled, the peaks are also taken into the samples. Consequently, the resultant data includes large noise and communication quality deteriorates. To address this problem, one possible way is to take such a measure in the layout process as to avoid signal line arrangement in which digital and analog signal lines are arranged close to each other, for example. However, an increase in the integration degree makes it difficult to take this measure in the layout process. Instead, another possible way is to take a measure using error correction code. However, when the error correction code is used to correct a signal influenced by the interference, the exerted error correction performance is lower than the intrinsic performance level of the error correction code. For this reason, as a method of reducing interference with an analog signal from a digital signal, there is a technique of reducing influence of interference by interpolation processing using a digital filter. This interference reduction technique is disclosed in Japanese Patent Application Publication No. Hei 06-252973. Also there is a technique of reducing influence of interference by performing sampling at timings shifted from originally-designed timings. This interference reduction technique is disclosed in Japanese Patent Application Publications Nos. Hei 09-153802 and 2001-53609.

However, these techniques have a drawback in that the techniques can produce the effects by only when a digital signal of interference origin and sampling clock are synchronous with each other, but cannot obtain good communication quality when the digital signal and the sampling clock are asynchronous with each other.

SUMMARY OF THE INVENTION

According to an aspect of the invention is provided an interference reduction device, comprising an analog to digital converter (A/D converter: ADC) to perform A/D conversion on input analog signal at frequency twice as high as output frequency, a serial to parallel converter (S/P converter) to repeatedly perform a session of distribution processing in which a digital signal obtained by the A/D conversion is distributed on a symbol basis to two destinations in a predetermined order, a digital filter to receive the signal distributed at the first timing in each session of the distribution processing and to output the signal after a filter operation at the output frequency, an interpolation filter to receive the signal other than the signal distributed at the first timing in each session of the distribution processing, to perform a filter operation, also to perform interpolation processing to thereby generate the signal distributed to the digital filter in the distribution processing, and to output the generated signal at the output frequency, a sampling unit to sample the inputted digital signal at frequency twice as high as the output frequency, a decision unit to decide which one of the digital filter and the interpolation filter has received smaller influence of interference of the input digital signal, on the basis of a sampling result by the sampling unit, and a selector to output one of the signals outputted by the digital filter and the interpolation filter, on the basis of a decision result of the decision unit.

According to another aspect of the invention is provided an interference reduction device, comprising an analog to digital converter (A/D converter: ADC) to perform A/D conversion on input analog signal at frequency M (M is an integer of 3 or more) times as high as output frequency, a serial to parallel converter (S/P converter) to repeatedly perform a session of distribution processing in which a digital signal obtained by the A/D conversion is distributed on a symbol basis to M destinations in a predetermined order, a digital filter to receive the signal distributed at the first timing in each session of the distribution processing and to output the signal after a filter operation at the output frequency, (M−1) interpolation filters each to receive the signal other than the signal distributed at the first timing in each session of the distribution processing, to perform a filter operation, also to perform interpolation processing to thereby generate the signal distributed to the digital filter in the distribution processing, and to output the generated signal at the output frequency, a sampling unit to sample the inputted digital signal at frequency M times as high as the output frequency, a decision unit to decide which one of the digital filter and the (M−1) interpolation filters has the smallest influence of interference of the input digital signal, on the basis of a sampling result by the sampling unit, and a selector to output one of the signals outputted by the digital filter and the (M−1) interpolation filters, on the basis of a decision result of the decision unit.

According to another aspect of the invention is provided an interference reduction device, comprising an analog to digital converter (A/D converter: ADC) to perform A/D conversion on input analog signal at frequency M (M is an integer of 3 or more) times as high as output frequency, a serial to parallel converter (S/P converter) to repeatedly perform a session of distribution processing in which a digital signal obtained by the A/D conversion is distributed on a symbol basis to M destinations in a predetermined order, a buffer to receive the signal distributed at the first timing in each session of the distribution processing and to output the symbols in a first-in first-out order, (M−1) interpolation filters each to receive the signal other than the signal distributed at the first timing in each session of the distribution processing, to perform a filter operation, also to perform interpolation processing to thereby generate the signal distributed to the buffer in the distribution processing, and to output the generated signal at the output frequency, a sampling unit to sample the inputted digital signal at frequency M times as high as the output frequency, a decision unit to decide which one of the buffer and the (M−1) interpolation filters has received the smallest influence of interference of the input digital signal, on the basis of a sampling result by the sampling unit; and a selector to output one of the signals outputted by the buffer and the (M−1) interpolation filters, on the basis of a decision result of the decision unit.

DETAILED DESCRIPTION OF THE INVENTION

Hereinafter, interference reduction devices according to embodiments of the invention will be described with reference to the accompanying drawings.

Figure 1:
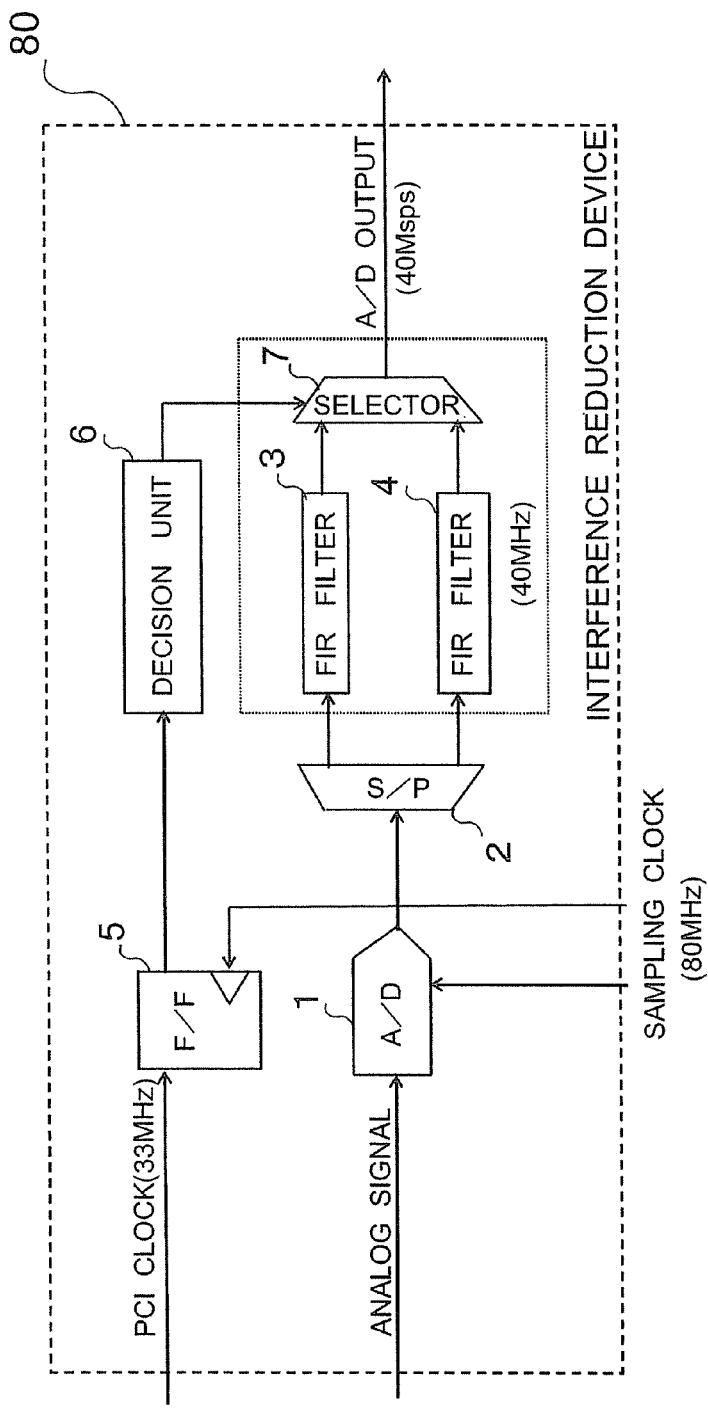
FIG. 1 is a diagram showing a configuration example of an interference reduction device according to a first embodiment of the invention.

An interference reduction device according to a first embodiment of the invention will be described with reference to the accompanying drawings. FIG. 1 is a diagram showing a configuration example of the interference reduction device. As shown in FIG. 1, an interference reduction device 80 includes an analog-to-digital converter (A/D converter: "ADC") 1, a serial-to-parallel converter (S/P converter) 2, a finite impulse response (FIR) filter 3, a FIR filter 4, a flip-flop 5, a decision unit 6, and a selector 7.

The A/D converter 1 converts an analog signal into a digital signal. Here, a sampling clock is set at 80 MHz. The S/P converter 2 performs serial-to-parallel conversion on symbols outputted from the A/D converter 1. The FIR filter 3 and the FIR filter 4 are digital filters in use. The FIR filter 4 performs interpolation processing to make the output timing of the FIR filter 4 coincident with the output timing of the FIR filter 3. The flip-flop 5 samples a peripheral component interconnect (PCI) clock included in a digital signal, on the basis of the sampling clock, detects H/L (high/low) of the PCI clock and outputs the detection result as a sampling PCI clock. Here, the sampling clock is set at 80 MHz. The flip-flop 5 functions as a sampling unit.

The decision unit 6 decides which one of the FIR filter 3 and the FIR filter 4 to use to selectively output one of the inputted symbols, on the basis of the sampling PCI clock outputted from the flip-flop 5. The selector 7 selectively outputs one of the symbols outputted from the FIR filter 3 and the FIR filter 4 on the basis of the decision result of the decision unit 6.

With reference to FIGS. 2 to 5, description will be given for interference reduction processing by the interference reduction device 80, i.e., processing of reducing interference with an analog signal. Here, the description is based on the assumption that rising edges of a PCI clock signal which is an asynchronous digital signal adversely affect an analog signal input unit of a radio communication system in conformity with IEEE802.11a that is a 5 GHz band wireless LAN standard. For example, this is a case where a radio communication apparatus to deliver moving images and the like is equipped with the interference reduction device 80.

Figure 2:
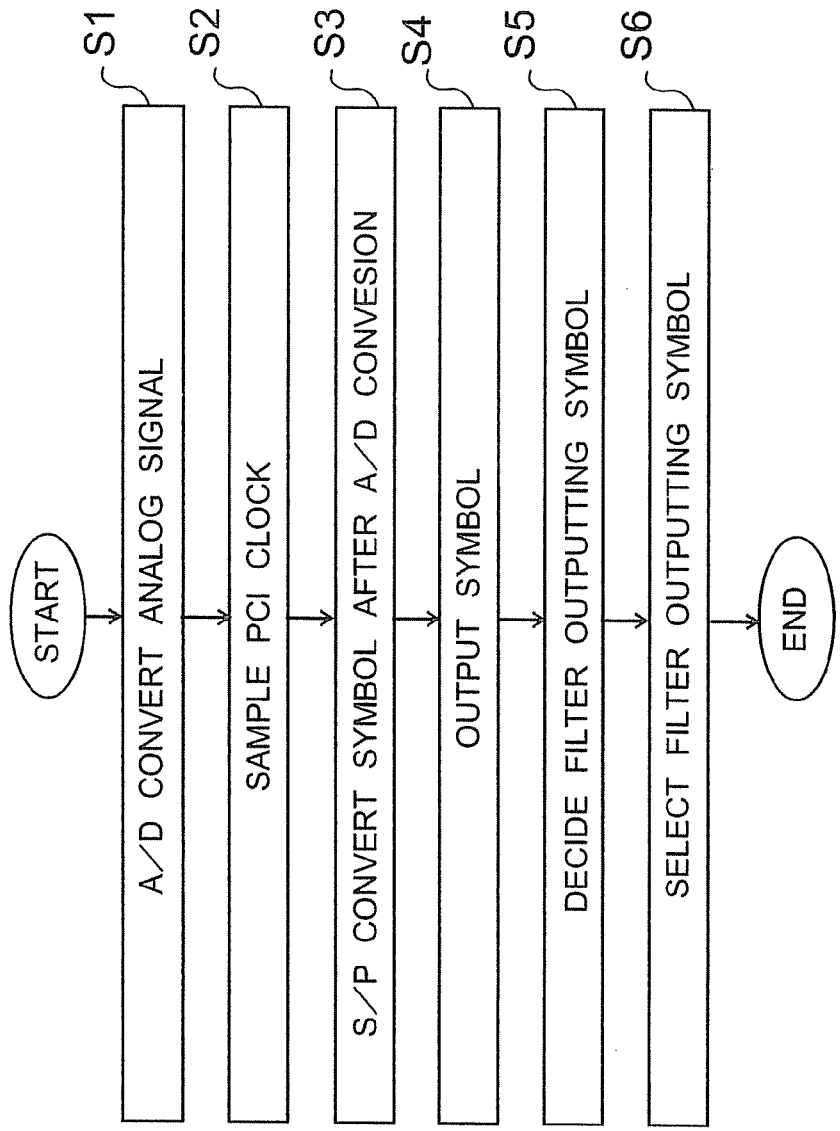
FIG. 2 is a flow chart showing interference reduction processing according to the first embodiment of the invention.

FIG. 2 is a flow chart showing the interference reduction processing. First, in the interference reduction device 80, the A/D converter 1 performs A/D conversion by using a sampling clock of 80 MHz that is twice as high as a desired A/D output of 40 Msps (MHz) (step S1). The A/D converter 1 outputs the sample signal after the A/D conversion to the S/P converter 2. In order to detect that the PCI clock is H (high) at least once within one clock cycle, the flip-flop 5 samples the PCI clock, which is the digital signal, by using the sampling clock of 80 MHz (step S2). Then, the flip-flop 5 outputs the sampling PCI clock, which is the PCI signal after sampling, to the decision unit 6. A rising edge of the sampling PCI clock indicates any time point within a time period when the PCI clock changes to L (low) after reaching H. The clock speed of 80 MHz is frequency high enough to observe the rising edges of the PCI clock of 33 MHz, and is one of multiples (a double value) of the desired sampling frequency of 40 MHz.

Figure 3:
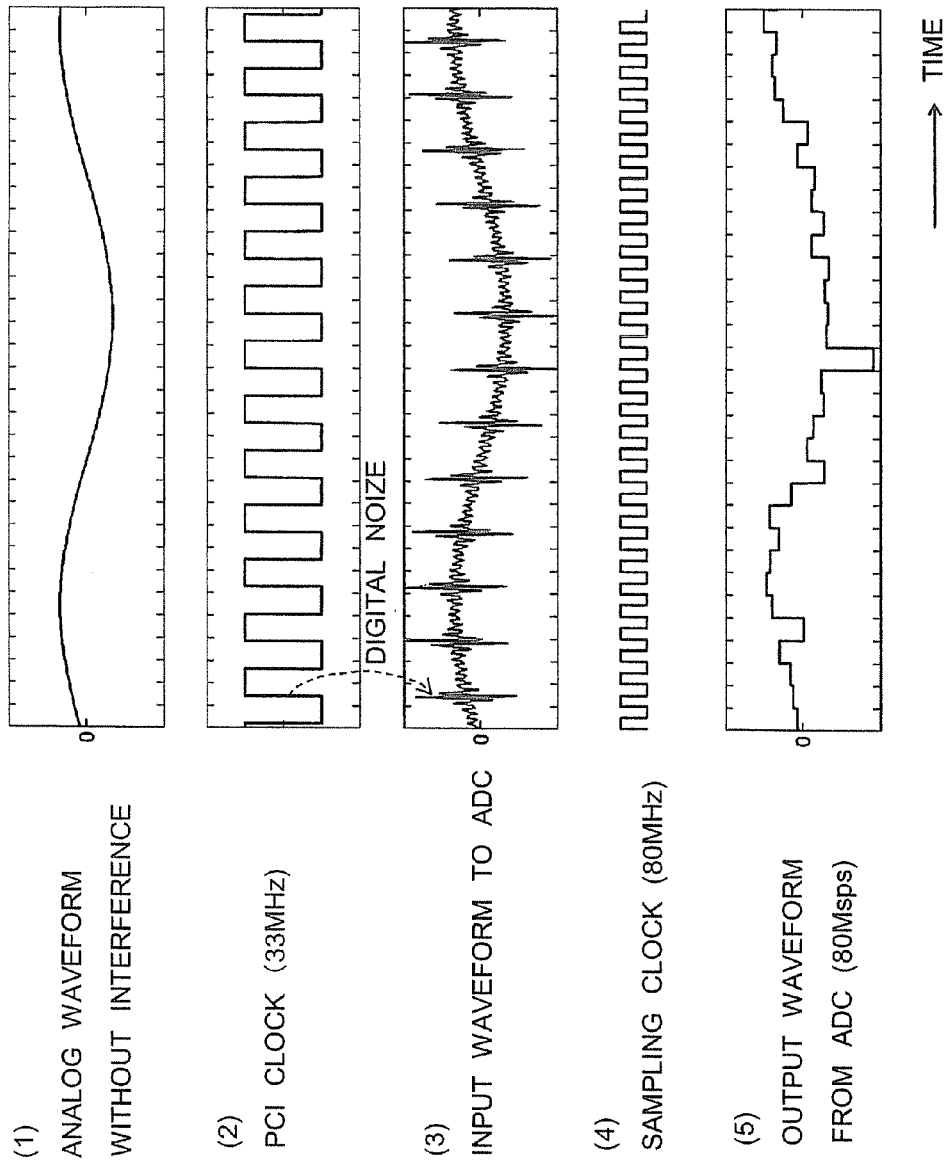
FIG. 3 is a diagram showing input waveforms to the interference reduction device according to the first embodiment of the invention.

FIG. 3 is a diagram showing input waveforms to the interference reduction device 80. When an analog signal without any influence of interference as shown in (1) in FIG. 3 is to be inputted to the interference reduction device 80, and when a digital signal line is located close to the analog signal line, the analog signal is influenced by the interference (digital noise) at timings of the rising edges of the PCI clock (Here, the PCI clock shown in (2) in FIG. 3), and therefore the digital noise is added to the analog signal as shown in (3) in FIG. 3. When the A/D converter 1 performs the A/D conversion on the analog signal influenced by the interference ((3) in FIG. 3), by using the sampling clock of 80 MHz ((4) in FIG. 3), the A/D converter 1 outputs a waveform as shown in (5) in FIG. 3, for example. If the A/D converter 1 performs the A/D conversion at a timing when the input signal ((3) in FIG. 3) includes the noise, the output waveform also includes the noise as shown in (5) in FIG. 3.

In the interference reduction device 80, the S/P converter 2 performs serial-to-parallel conversion on the sample signal (symbols) obtained by the A/D converter 1 (step S3). To be more precise, the S/P converter 2 outputs each even-numbered symbol to the FIR filter 3 and outputs each odd-numbered symbol to the FIR filter 4. The FIR filter 3 receives a signal that is obtained through the normal 40 MHz sampling, whereas the FIR filter 4 receives a signal that is obtained through the 40 MHz sampling at a timing delayed by 12.5 ns from the timing of the normal sampling.

The FIR filter 3 performs a filter operation on the inputted symbol and then output the resultant symbol to the selector 7. The FIR filter 4 performs a filter operation on the inputted symbol and also interpolation processing to generate a symbol shifted earlier in time by 12.5 ns from the inputted symbol, and then outputs the resultant symbol to the selector 7 at the same output timing as the FIR filter 3 (step S4). Such interpolation processing can be implemented by appropriately obtaining tap coefficients of the respective FIR filters. The details will be described later.

Next, the decision unit 6 detects a rising edge of the sampling PCI clock. The decision unit 6 decides to "use a symbol outputted by the FIR filter 4" when the rising edge timing is coincident with the output timing of the FIR filters, and outputs the decision result to the selector 7 (step S5). On the other hand, when the rising edge timing is different from the output timing, the decision unit 6 decides to "use a symbol outputted by the FIR filter 3" and then outputs the decision result to the selector 7 (step S5).

The selector 7 selects the symbol outputted from the FIR filter 4, in accordance with the decision result of the decision unit 6, when the rising edge timing of the sampling PCI clock is determined as coincident with the output timing of the FIR filters. The selector 7 selects and outputs the symbol outputted from the FIR filter 3 when the rising edge timing is determined as different timing (step S6). When the rising edge timing of the sampling PCI clock is determined as coincident with the output timing of the FIR filters, the sampled signal is highly likely to include strong interference noise, and therefore is replaced with the signal generated from the signal sampled at the timing delayed by 12.5 ns. This replacement reduces the influence of the interference.

Figure 4:
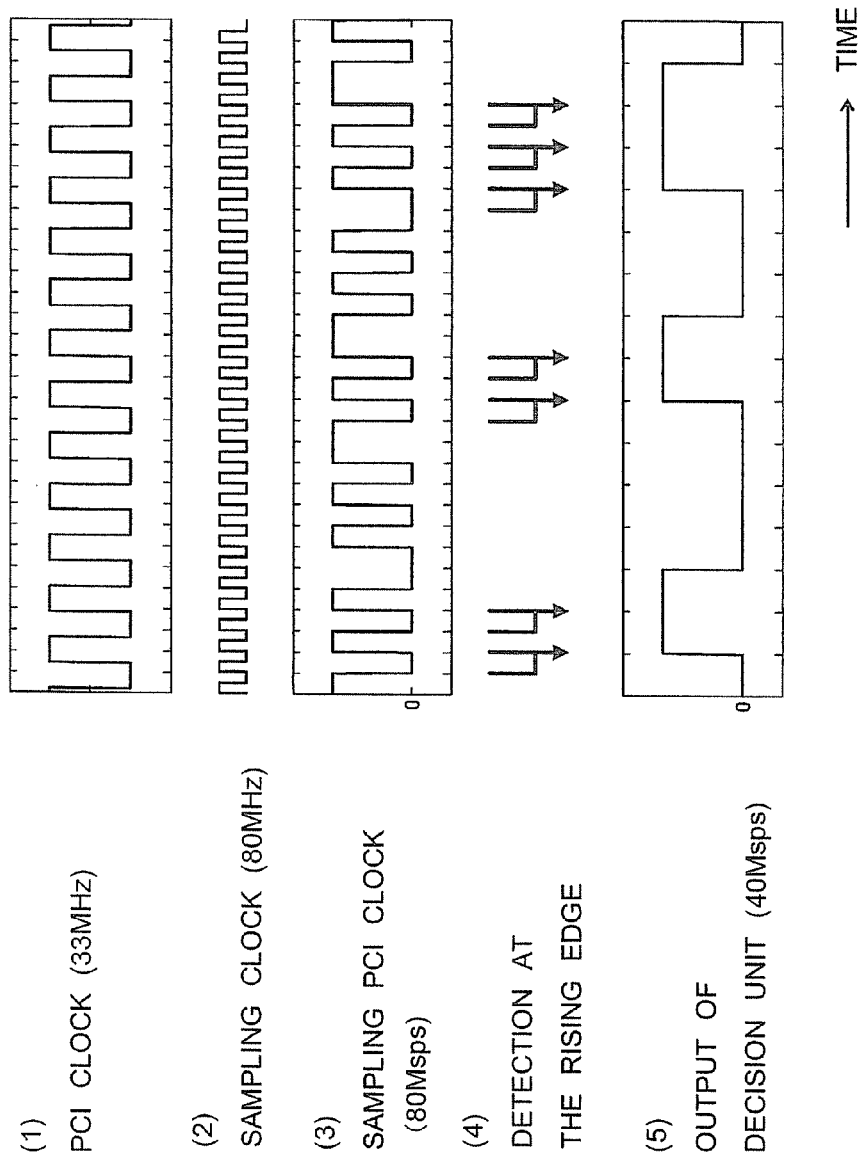
FIG. 4 is a diagram showing a specific example of decision processing by a decision unit according to the first embodiment of the invention.

FIG. 4 is a diagram showing a specific example of decision processing by the decision unit 6. For example, when the flip-flop 5 samples the PCI clock ((1) in FIG. 4) by using the same sampling clock ((2) in FIG. 4) as the A/D converter 1, sampling PCI clocks outputted from the flip-flop 5 are illustrated as shown in (3) in FIG. 4. The decision unit 6 detects each rising edge of the sampling PCI clock, and outputs the decision result indicating "use a symbol outputted from the FIR filter 4" to the selector 7, when the timing of the detected rising edge is coincident with the output timing of the FIR filters ((4) in FIG. 4). Here, a signal H (high) is outputted as the decision result to use the symbol outputted from the FIR filter 4, whereas a signal L (low) is outputted as the decision result to use the symbol outputted from the FIR filter 3 ((5) in FIG. 4).

Figure 5:
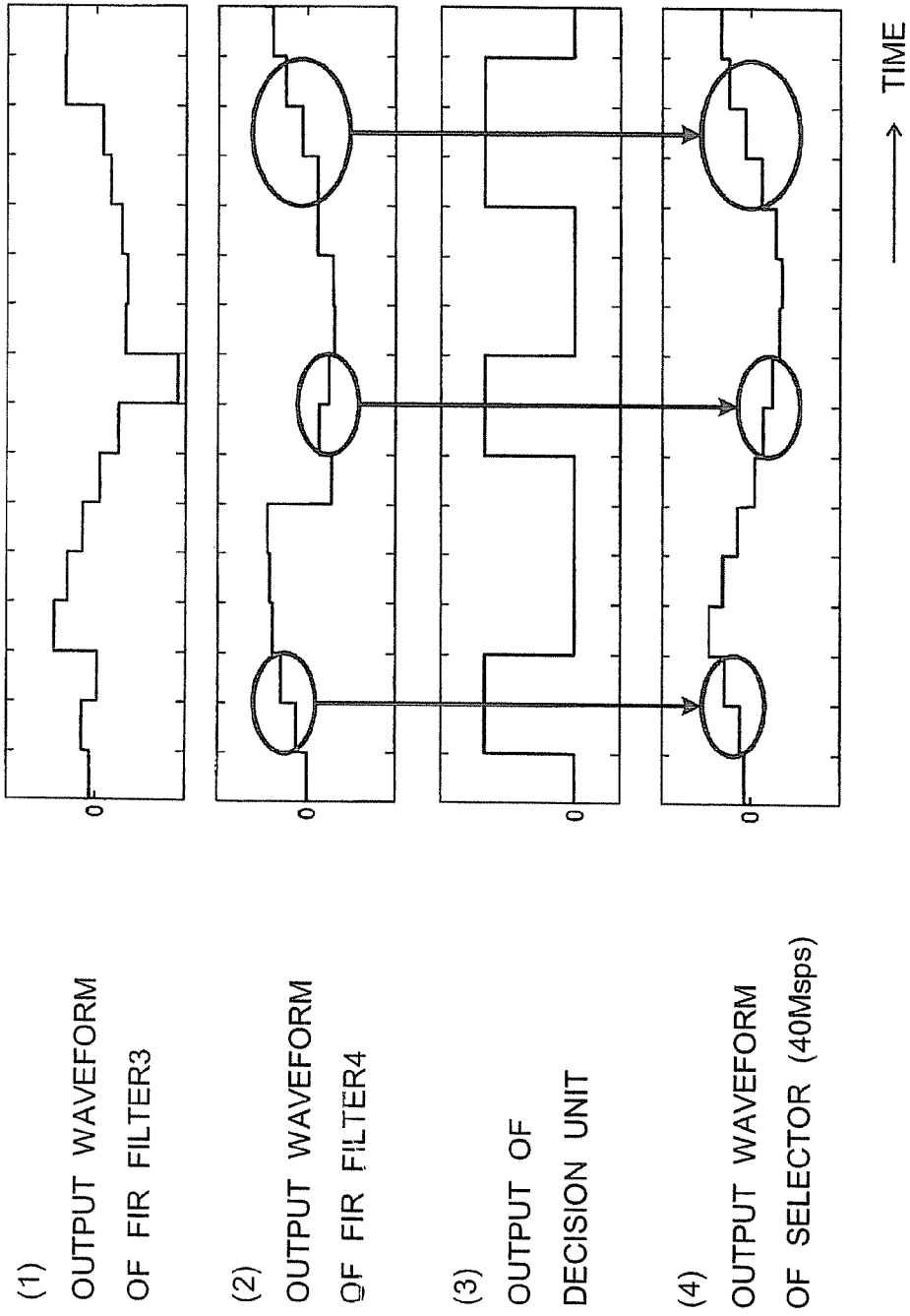
FIG. 5 is a diagram showing input and output waveforms to and from a selector according to the first embodiment of the invention.

FIG. 5 is a diagram showing input and output waveforms to and from the selector 7. The selector 7 selects symbols ((1) in FIG. 5) outputted from the FIR filter 3 while the decision result ((3) in FIG. 5) of the decision unit 6 is L. The selector 7 selects symbols ((2) in FIG. 5) outputted from the FIR filter 4 while the decision result is H. As a result, the output from the selector 7 is as shown in (4) in FIG. 5. As is clear from the output, the interference reduction device 80 is capable of obtaining A/D output from which noise components are reduced as compared with the output ((1) in FIG. 5) from the FIR filter 3, which is the output when the A/D conversion is performed at sampling frequency of 40 MHz.

Here, the tap coefficients of the FIR filter 3 and the FIR filter 4 are figured out in the following manner. Firstly, a sinc function having a bandwidth of 20 MHz is generated. Then, the sinc function is sampled at 40 MHz so that peaks of the sinc function can be included in the sampling. A set of values thus obtained is used as tap coefficients to design a normal FIR filter that operates at 40 MHz. The FIR filter 3 employs these tap coefficients. In addition, the sinc function is sampled at 40 MHz at timings shifted by 12.5 ns (here, timing shifted forward), and thereby another set of tap coefficients is obtained. The FIR filter 4 employs another set of tap coefficients. Here, a tap coefficient is used, but, a tap factor may be also used.

When the same waveform is inputted to the FIR filter 3 and the FIR filter 4, the FIR filter 4 outputs a waveform shifted earlier in time by 12.5 ns, for example, from the inputted waveform, as a waveform usable in place of the waveform outputted from the FIR filter 3. As in the interference reduction device 80 of the present embodiment, when the input signal to the FIR filter 4 is a signal sampled at a timing delayed by 12.5 ns from the input signal to the FIR filter 3, the interpolation is performed to cancel out the input timing delay in the output signals from the FIR filters 3, 4, and thereby the output signals of the two filters can be treated as singles sampled at the same timing. In this way, the output symbol from the FIR filter 3 influenced by the interference can be replaced with the output symbol from the FIR filter 4.

As has been described above, the interference reduction device of the embodiment is configured as follows. Specifically, the A/D converter performs the A/D conversion at the frequency twice as high as the desired A/D output frequency. The digital signal interfering with the analog signal is also sampled at the frequency twice as high as the desired A/D output frequency. The sample signal after the A/D conversion is outputted to the different FIR filters alternately. Then, the output from the FIR filter less influenced by the interference of the digital signal is selected on the basis of the value of the signal sampled from the digital signal. In this way, the interference reduction device having the above configuration is capable of obtaining the A/D output from which the interference of the digital signal is reduced, even when the digital signal is asynchronous with the sampling clock.

The embodiment has been described for the case where the sampling frequency is twice as high as the desired A/D output. However, the sampling frequency is not necessarily limited to this. Since any of the multiples of the desired frequency may be used as the sampling frequency, the sampling frequency may be appropriately set at a triple value, fourfold value or the like, for example.

The embodiment has been described for the case where the rising edges of the digital signal influence the analog signal. However, what influences an analog signal is not necessarily limited to the rising edges. The embodiment is applicable to any case where an analog signal is influenced by falling edges of the digital signal, or both of the rising edges and falling edges of the digital signal.

In the embodiment, the flip-flop has been described as a device to sample the PCI clock that is a digital signal. However, such device is not necessarily limited to this. Any sampling device can be used as long as the device is capable of detecting that each value of the digital signal is H or L.

The embodiment has been described for the case where the FIR filters are used. However, a usable filter is not necessarily limited to this type. A delay chain, an interpolation filter, or the like may be used. For example, in the case of using the interpolation filter, a symbol to be replaced may be calculated through computation processing using symbols alternately inputted by the S/P converter.

When a cycle at which the interference of the asynchronous digital signal becomes strong is already known, a sampling interval may be made longer to the following extent. Specifically, the sampling interval may be set equal to or shorter than: a half of the cycle at which the interference becomes strong if only either the rising edges or the falling edges of the digital signal are desired to be detected; and a quarter of the cycle at which the interference becomes strong if both the rising edges and the falling edges of the digital signal are desired to be detected. Such long sampling interval enables simplification of the configuration of each of the FIR filters and leads to reduction in power consumption.

In the embodiment, the sampling timing is the rising edge of the sampling clock. The sampling timing is not necessarily limited to this. The sampling timing may be the same timing as a falling edge of the sampling clock, or both a falling edge and a rising edge of the sampling clock. Even in this case, power consumption can be reduced.

Figure 6:
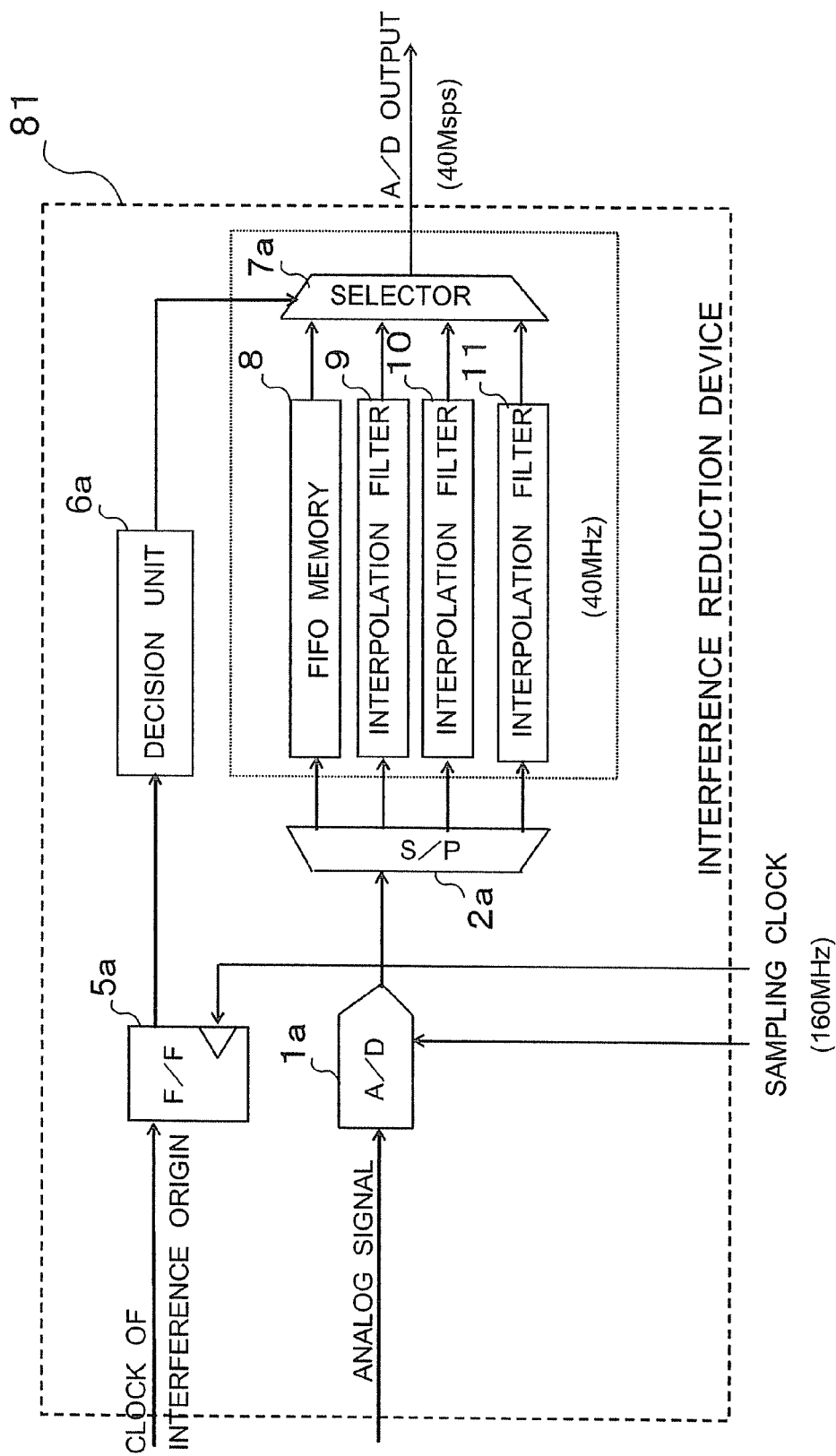
FIG. 6 is a diagram showing a configuration example of the interference reduction device according to a second embodiment of the invention.

Hereinafter, an interference reduction device according to a second embodiment of the invention will be described with reference to the accompanying drawings. FIG. 6 is a diagram showing a configuration example of the interference reduction device. In the embodiment, A/D conversion of an analog signal and sampling of clock of interference origin are performed at frequency four times as high as a desired A/D output frequency. The following description will be provided for part different from the first embodiment.

As shown in FIG. 6, an interference reduction device 81 includes an A/D converter 1a, an S/P converter 2a, a FIFO memory 8, interpolation filters 9 to 11, a flip-flop 5a, a decision unit 6a and a selector 7a. The interference reduction device 81 is installed in a radio communication apparatus to deliver moving images and the like, for example.

The A/D converter 1a converts an analog signal into a digital signal. Here, the sampling clock is set at 160 MHz. The S/P converter 2a performs serial-to-parallel conversion on symbols outputted from the A/D converter 1a. The FIFO memory 8 is a buffer to output symbols in a first-in first-out order. The interpolation filters 9, 10, 11 are digital filters to perform interpolation processing to make the output timings of the FIR filters 9, 10, 11 coincident with the output timing of the FIFO memory 8. The flip-flop 5a detects H/L of the clock of interference origin, which is a digital signal, by sampling the clock of interference origin by using the sampling clock. The flip-flop 5a functions as a sampling unit. Here, the sampling clock is set at 160 MHz. The decision unit 6a decides which one of the FIFO memory 8 and the interpolation filters 9 to 11 to use to selectively output one of the inputted symbols, on the basis of the sampling clock of interference origin outputted from the flip-flop 5a. The selector 7a selectively outputs the symbol outputted from one of the FIFO memory 8 and the interpolation filters 9 to 11 in accordance with the decision result of the decision unit 6a.

Figure 7:
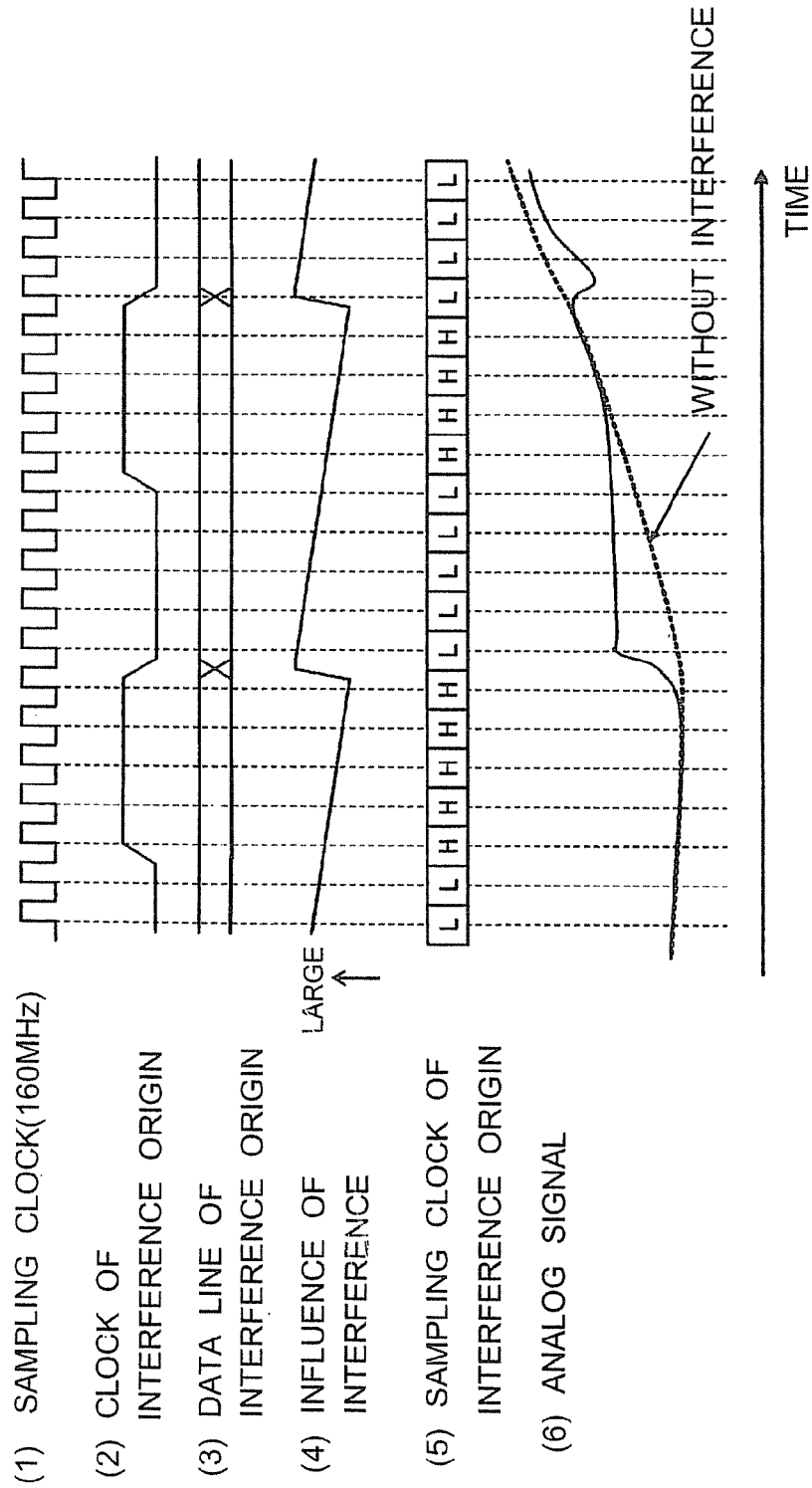
FIG. 7 is a diagram showing input waveforms to the interference reduction device according to the second embodiment of the invention.

Relation between the sampled analog signal and the digital signal line as the interference origin will be described with reference to FIG. 7. FIG. 7 is a diagram showing input waveforms to the interference reduction device. Here, the digital signal line is a digital signal bus composed of a clock line of interference origin and a large number of data lines of interference origin.

In FIG. 7, (1) shows a sampling clock of 160 MHz. Timing relation between the clock of interference origin and the data line of interference origin, and the influence of interference on the analog signal can be understood from the clock of interference origin ((2) in FIG. 7), the data line of interference origin ((3) in FIG. 7), and the influence of interference ((4) in FIG. 7). Specifically, the values of the data lines of interference origin change at the falling edges of the clock of interference origin. A receiving side of the bus mentioned here is supposed to receive a signal at timings of the rising edges of the clock. The bus includes a very large number, i.e., several tens, for example, of data lines. For this reason, the analog signal receives larger interference at timings of toggles of the data lines than at a timing of the rising edge and/or falling edge of the clock. Here, the influence of such interference gradually decreases over time. Note that the sampling clock of interference origin ((5) in FIG. 7) shows values obtained by sampling the clock of interference origin with the sampling clock ((1) in FIG. 7).

Under an idealistic condition, an analog signal without influence of interference as shown by a dotted line portion of (6) in FIG. 7 is inputted to the interference reduction device 81. In reality, however, the analog signal receives the influence of interference ((4) in FIG. 7) at timings of falling edges of the clock of interference origin that are timings of change in the data values of the data lines of interference origin. Due to such influence, the analog signal shown by a solid line portion in (6) in FIG. 7 is inputted. The analog signal thus influenced has a waveform including noise at timings when the interference becomes strong ((4) in FIG. 7), as shown in the analog signal in (6) in FIG. 7, for example. In order to output a signal while avoiding a sample influenced by the strong interference, the interference reduction device 81 in the embodiment reduces the interference with the analog signal by performing the following operation.

Figure 8:
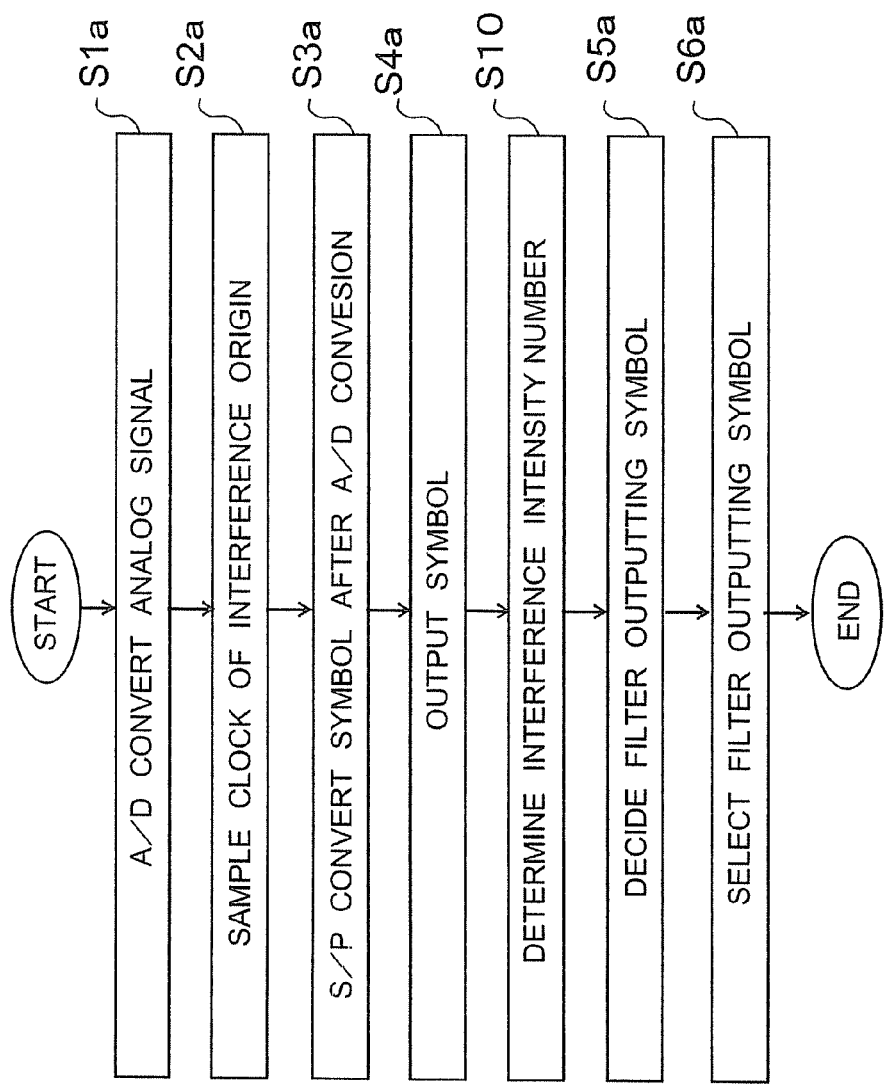
FIG. 8 is a flow chart showing interference reduction processing according to the second embodiment of the invention.

Hereinafter, the reduction of interference with an analog signal will be described with reference to FIG. 8. FIG. 8 is a flow chart showing interference reduction processing. Firstly, the A/D converter 1a performs the A/D conversion by using the sampling clock of 160 MHz that is four times as high as the desired A/D output of 40 Msps (MHz) (step S1a). The A/D converter 1a outputs the sample signal after the A/D conversion to the S/P converter 2a. The flip-flop 5a samples the clock of interference origin by using the sampling clock of 160 MHz (step S2a). Then, the flip-flop 5a outputs the sampling clock of interference origin, which is the signal after sampling, to the decision unit 6a. The output from the flip-flop 5a is shown as the sampling clock of interference origin ((5) in FIG. 7) in FIG. 7. Note that the clock speed of 160 MHz is frequency high enough to observe rising edges of the clock of interference origin of 33 MHz, and is one of multiples (a fourfold value) of the desired sampling frequency of 40 MHz.

Next, the S/P converter 2a performs serial-to-parallel conversion on the sample signal (symbols) obtained by the A/D converter 1a (step S3a). To be more precise, the S/P converter 2a outputs the symbols while distributing each four successive symbols to the FIFO memory 8, the interpolation filter 9, the interpolation filter 10 and the interpolation filter 11 in this order on a one-to-one basis. After outputting the symbol to the interpolation filter 11, the S/P converter 2a again outputs the next symbol to the FIFO memory 8, and then repeatedly outputs the symbols in the aforementioned manner.

The FIFO memory 8 outputs the symbols to the selector 7a in the first-in first-out order, while the interpolation filters 9, 10, 11 performs the interpolation processing on the inputted symbols and then outputs the resultant symbols to the selector 7a at the same timing as the output timing of the FIFO memory 8 (step S4a ). Specifically, the interpolation filters 9, 10, 11 perform interpolation calculation to generate symbols shifted earlier in time from the inputted symbols by 6.25 ns, 12.5 ns and 18.75 ns, respectively, in order that the input timing to the interpolation filters 9, 10, 11 can be adjusted to be coincident with the input timing of the data inputted to the FIFO memory 8. For the interpolation calculation, the FIFO memory 8 has a delay time as long as the operational latency of the interpolation filters. Consequently, all the symbols simultaneously inputted to the selector 7a can be regarded as symbols sampled at the same timing. The decision unit 6a decides which one of the four symbols to output, on the basis of the sampling clock of interference origin.

Figure 9:
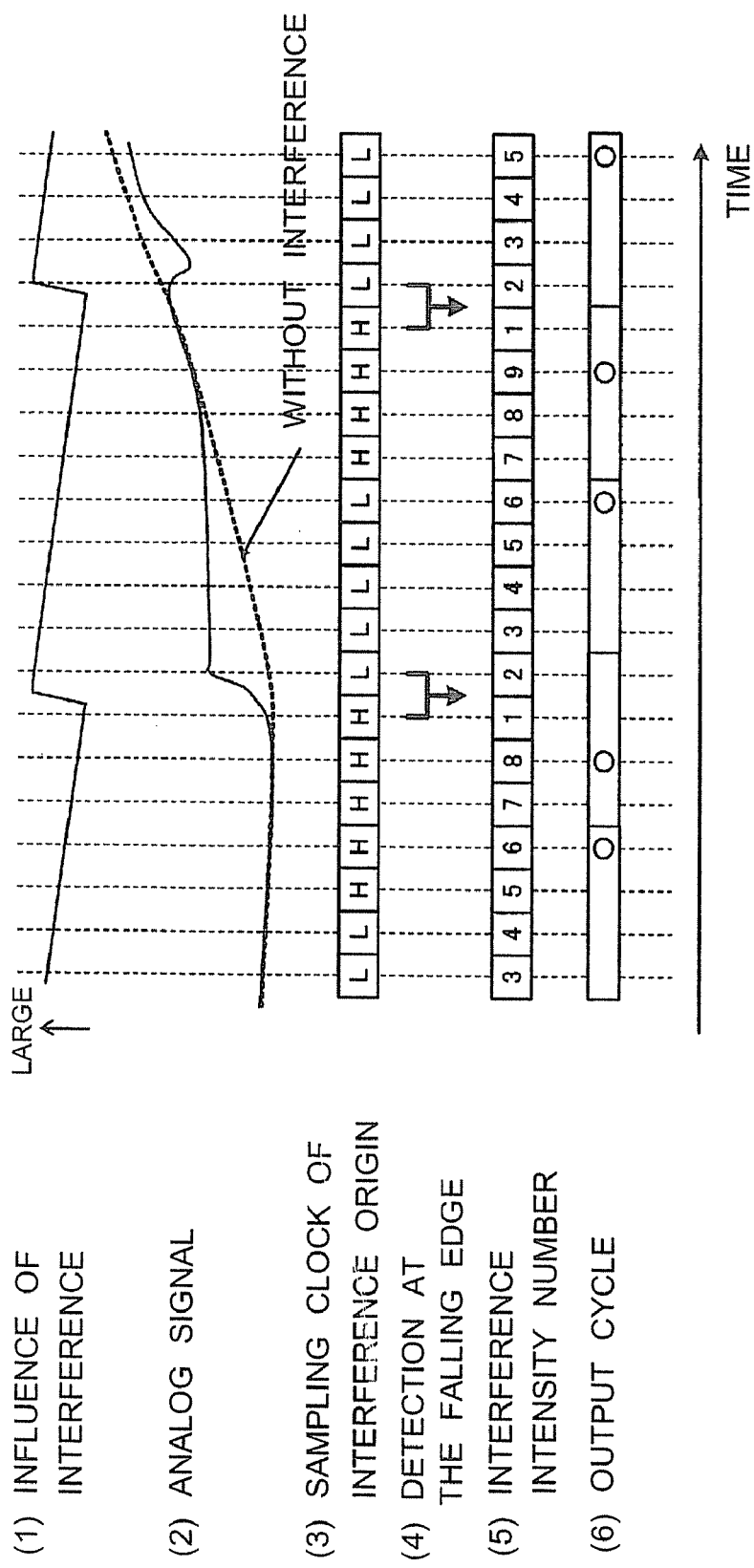
FIG. 9 is a diagram showing decision processing by a decision unit according to the second embodiment of the invention.

Subsequently, decision processing by the decision unit 6a will be described with reference to FIG. 9. FIG. 9 is a diagram showing the decision processing by the decision unit 6a. The bus of interference origin produces the maximum influence of interference around the falling edges of the clock of interference origin. Therefore, the samples have smaller influence of interference as more time passes from the timing of the maximum influence. For this reason, the decision unit 6a detects falling edges of the clock of interference origin shown in (4) in FIG. 9 from the sampling clock of interference origin ((3) in FIG. 9)) that is the output from the flip-flop 5a. The decision unit 6a can detect a falling edge by finding a time point between two sampling timings, in the first one of which the sampling clock of interference origin is H and in the second one of which the sampling clock of interference origin is L.

Then, the decision unit 6a determines interference intensity numbers in order to presume a portion having strong interference and to avoid the portion having strong interference (step S10). The interference intensity numbers are determined by assigning 1 to the H timing immediately before the detected falling edge of the clock and by assigning 2 to the L timing immediately after the detected falling edge. Then, each of the samples at the following timings before the detection of the next falling edge is assigned, as the intensity number, a value incremented by 1 from the intensity number of the previous timing ((5) in FIG. 9). When the intensity numbers are assigned in the aforementioned manner, the interference intensity number increases as the interference decreases. The decision unit 6a decides which sample has the weakest interference among every four samples (of the same number as the number into which the S/P converter 2a divides the symbols). In other words, the sample assigned the largest interference intensity number is selected from the four samples. The decision unit 6a decides which filter receives the symbol corresponding to the largest interference number, and outputs the decision result to the selector 7a (step S5a). The following description shows an example of a possible method of deciding the filter for the case where the samples are divided into four. In this case, the timing of the first sample is made synchronous with the timing of the sample distributed to the FIFO memory 8 by the S/P converter 2a, thereby making the first sample correspond to the sample inputted to the FIFO memory 8. Then, the following second to forth samples are made to correspond to the samples distributed to the interpolation filters 9 to 11, respectively. According to these correspondences, the filter to be decided can be identified. The selector 7a selects the filter from which the symbol is to be outputted, on the basis of the decision result of the decision unit 6a (step S6a).

As has been described, the interference reduction device of the embodiment uses the sampling clock having frequency four times as high as the desired A/D output. Also in this case, the interference reduction device is capable of obtaining the A/D output from which the interference by the digital signal is reduced, as is the case with the first embodiment.

Figure 10:
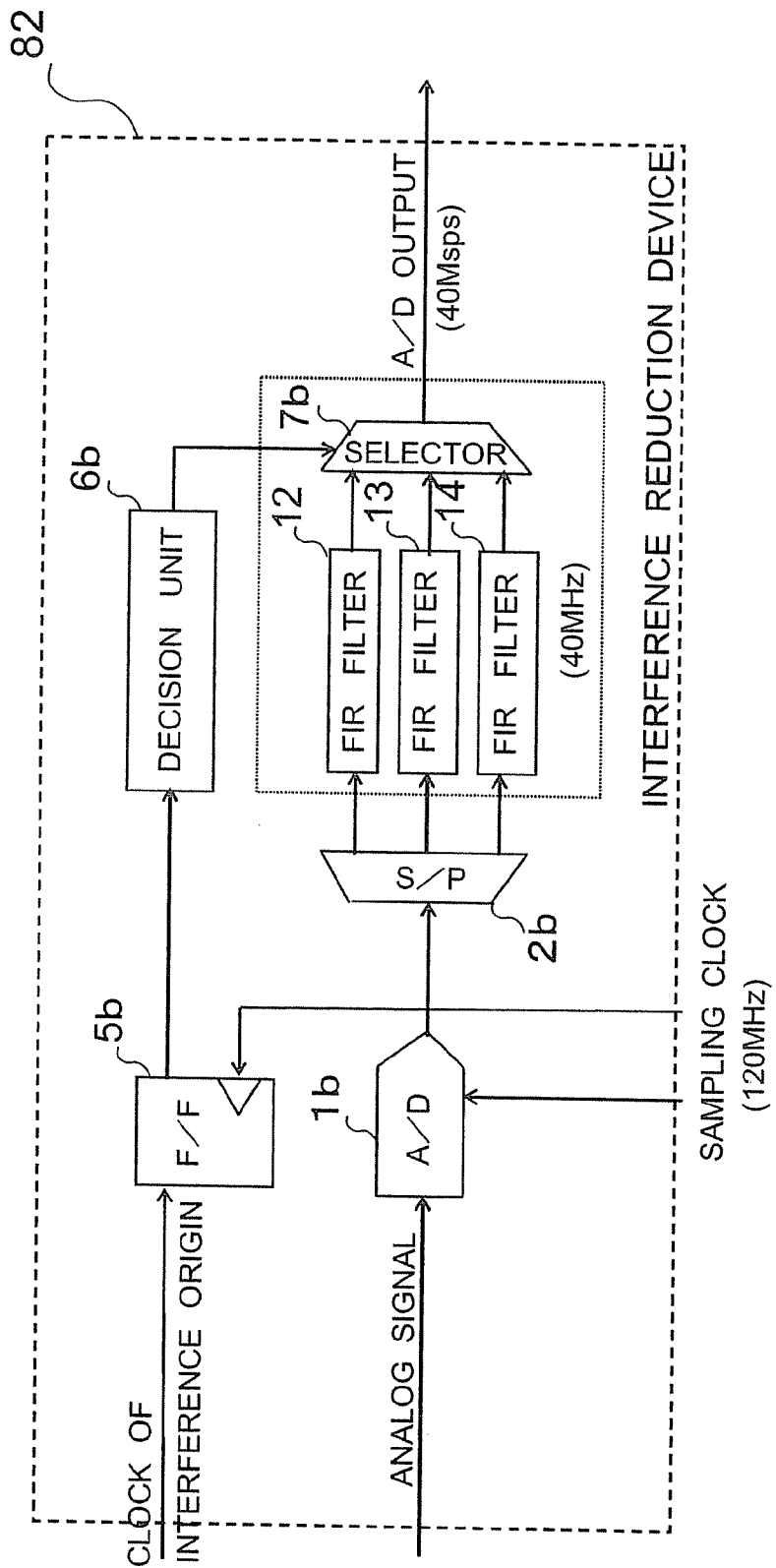
FIG. 10 is a diagram showing a configuration example of the interference reduction device according to a third embodiment of the invention.

A third embodiment of the invention will be described with reference to the accompanying drawings. FIG. 10 is a diagram showing a configuration example of the interference reduction device. In the embodiment, the decision unit calculates an interference intensity of each FIR filter, and makes a decision such that a symbol outputted from the FIR filter having the smallest interference intensity will be outputted. The following description will be provided only for part different from the first and second embodiments.

As shown in FIG. 10, an interference reduction device 82 includes an A/D converter 1b, an S/P converter 2b, FIR filters 12 to 14, a flip-flop 5b, a decision unit 6b and a selector 7b.

The interference reduction device 82 is installed in a radio communication apparatus to deliver moving images and the like, for example.

The A/D converter 1b converts an analog signal to a digital signal. Here, the sampling clock is set at 120 MHz. The S/P converter 2b performs serial-to-parallel conversion on symbols outputted from the A/D converter 1b. The FIR filters 12 to 14 are digital filters. The FIR filter 13 and the FIR filter 14 perform interpolation processing to make the output timings of the FIR filters 13, 14 coincident with the output timing of the FIR filter 12. The flip-flop 5b detects H/L of the clock of interference origin, which is a digital signal, by sampling the clock of interference origin by using the sampling clock. The flip-flop 5b functions as a sampling unit. Here, the sampling clock is set at 120 MHz. The decision unit 6b decides which one of the FIR filters 12, 13, 14 to use to selectively output one of the inputted symbols, on the basis of the sampling clock of interference origin outputted from the flip-flop 5b. The selector 7b selectively outputs the symbol outputted from one of the FIR filters 12, 13, 14 in accordance with the decision result of the decision unit 6b.

In the embodiment, the sampling clock of the A/D converter 1b is set at 120 MHz that is three times as high as the desired A/D output frequency. For this reason, the interference reduction device 82 includes three FIR filters. Thus, every third sample outputted from the S/P converter 2b is inputted to each of the FIR filters. Here, the radio LAN IEEE802.11a is assumed as application used in the radio communication apparatus in which the interference reduction device 82 is installed. The FIR filter 12 performs a digital filter operation in which frequency components out of a central 20 MHz band used in the IEEE802.11a are cut off from an inputted waveform of 40 Msps. In the digital filter operation, when the FIR filter 12 is used for a direct conversion system which downconverts a radio waveform with a central frequency of a used frequency band, for example, the FIR filter 12 serves as a low pass filter. The FIR filter 13 and the FIR filter 14 both perform the same digital filter operation and also perform an interpolation filter operation to make the output timings of the FIR filters 13, 14 coincide with the output timing of the FIR filter 12.

Figure 11:
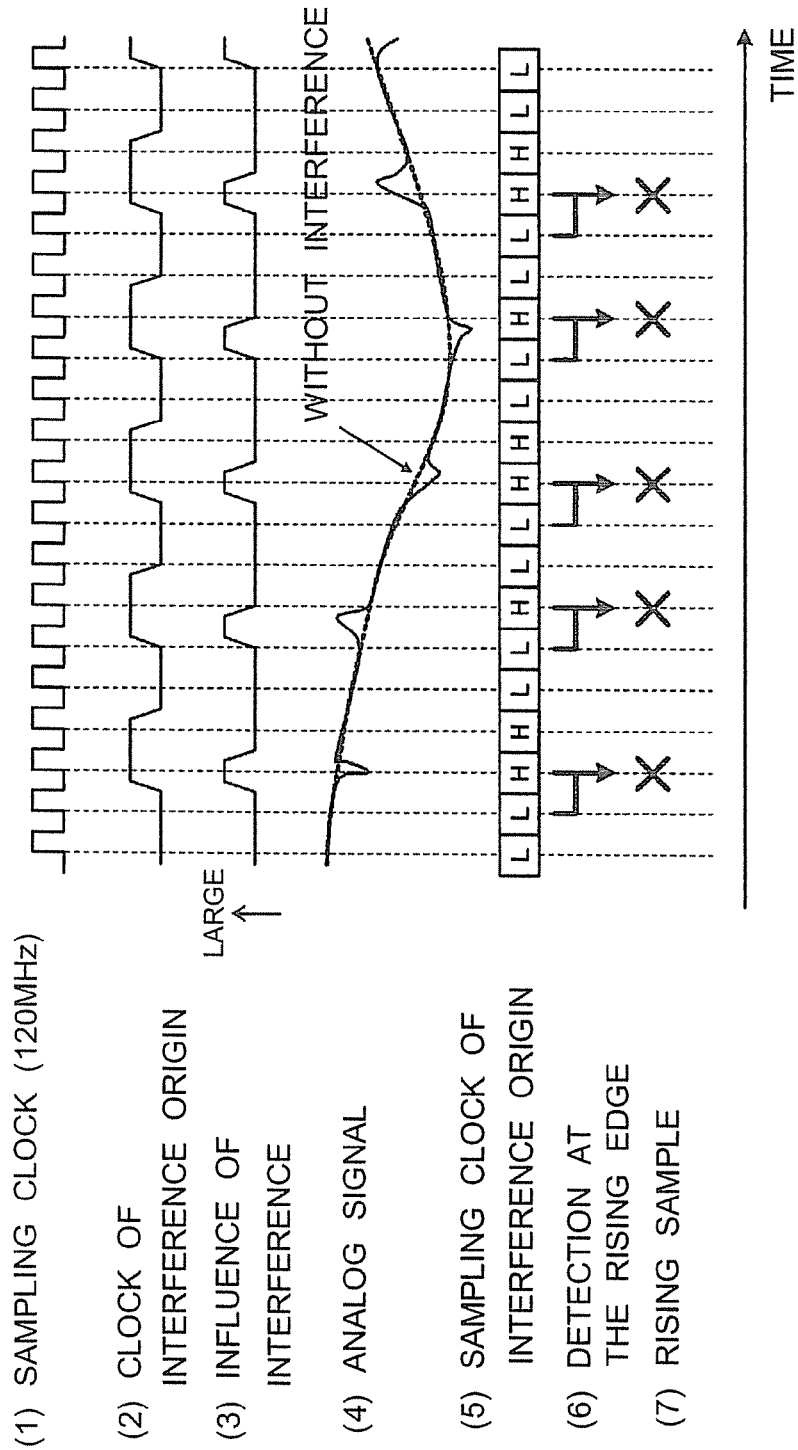
FIG. 11 is a diagram showing input waveforms to the interference reduction device according to the third embodiment of the invention.

Next, a relationship between the sampled analog signal and the digital signal line as the interference origin will be described with, reference to FIG. 11. FIG. 11 is a diagram showing clock of interference origin and influence of interference on an analog signal. In FIG. 11, (1) shows a sampling clock of 120 MHz. Here, the influence of interference becomes large at the moment of each rising edge of the clock of interference origin ((2) in FIG. 11) and then becomes small within a short time ((3) in FIG. 11). As shown in (4) in FIG. 11, the analog signal without interference and the analog signal influenced by the interference in the above case are expressed by a dotted line portion and a solid line portion, respectively. Sampling clock of interference origin ((5) in FIG. 11) is a result of sampling the clock of interference origin by the flip-flop 5b. The decision unit 6b calculates the influence of interference of each of the FIR filters, on the basis of the sampling clock of interference origin and a difference among tap coefficients of the FIR filters, and decides to select the FIR filter receiving the smallest influence of interference. The processing of the interference reduction device including the above decision processing will be described.

Figure 12:
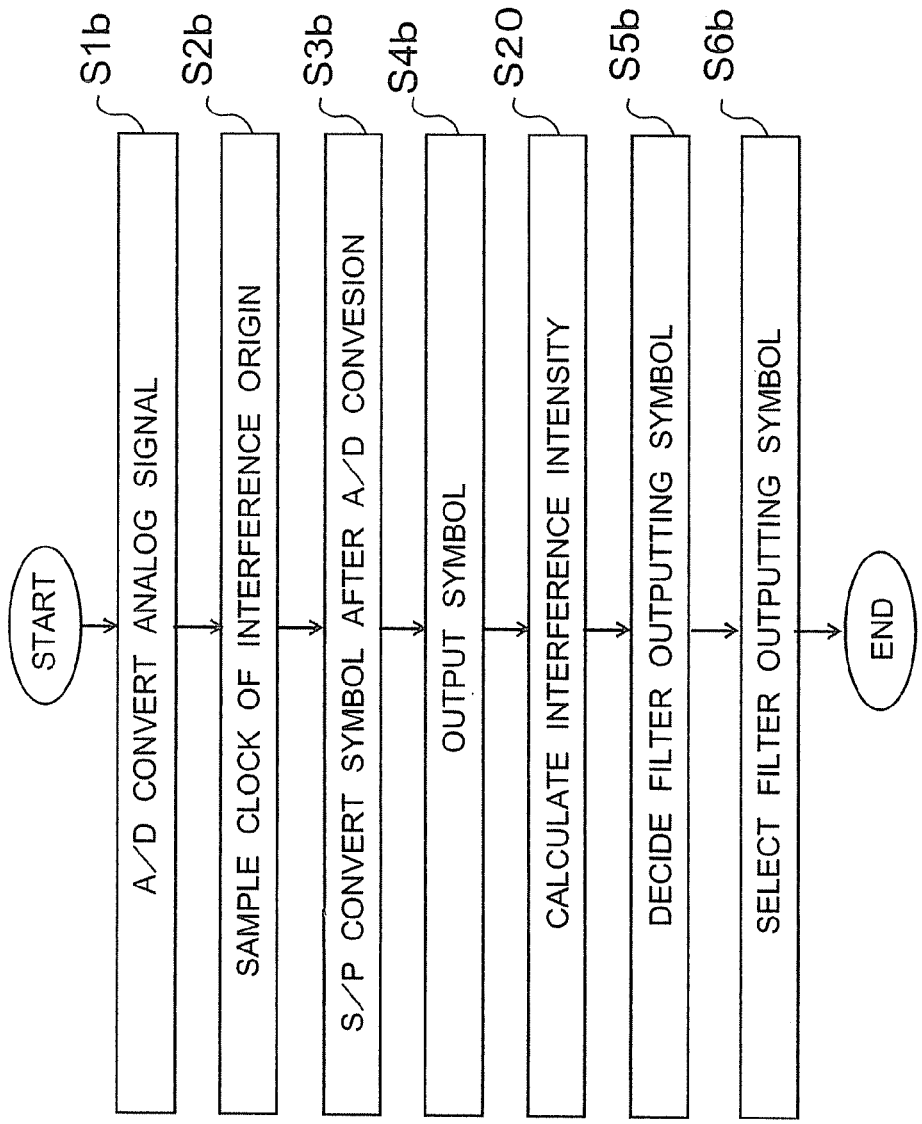
FIG. 12 is a flow chart showing interference reduction processing according to the third embodiment of the invention.

The processing of the interference reduction device including the decision processing will be described with reference to FIG. 12. FIG. 12 is a flow chart showing interference reduction processing. Firstly, the A/D converter 1b performs the A/D conversion by using the sampling clock of 120 MHz that is three times as high as the desired A/D output of 40 Msps (MHz) (step S1b). The A/D converter 1b outputs the sample signal after the A/D conversion to the S/P converter 2b. The flip-flop 5b samples the clock of interference origin by using the sampling clock of 120 MHz (step S2b). The flip-flop 5a outputs the sampling clock of interference origin, which is the signal after sampling, to the decision unit 6b.

Next, the S/P converter 2b performs serial-to-parallel conversion on the sample signal (symbols) obtained by the A/D converter 1b (step S3b). To be more precise, the S/P converter 2b outputs the symbols while distributing every three successive symbols to the FIR filters 12, 13, 14 in this order on a one-to-one basis. After outputting a symbol to the FIR filter 14, the S/P converter 2b again outputs the next symbol to FIR filter 12, and then repeatedly outputs the symbols in the aforementioned manner.

Subsequently, the FIR filter 12 performs a filter operation on the inputted symbol and outputs the resultant symbol to the selector 7b. The FIR filters 13, 14 perform the filter operation and interpolation processing to make the output timings of the filters 13, 14 coincident with the output timing of the FIR filter 12, and outputs the inputted symbol to the selector 7b at the same timing as the FIR filter 12 (step S4b).

Figure 13:
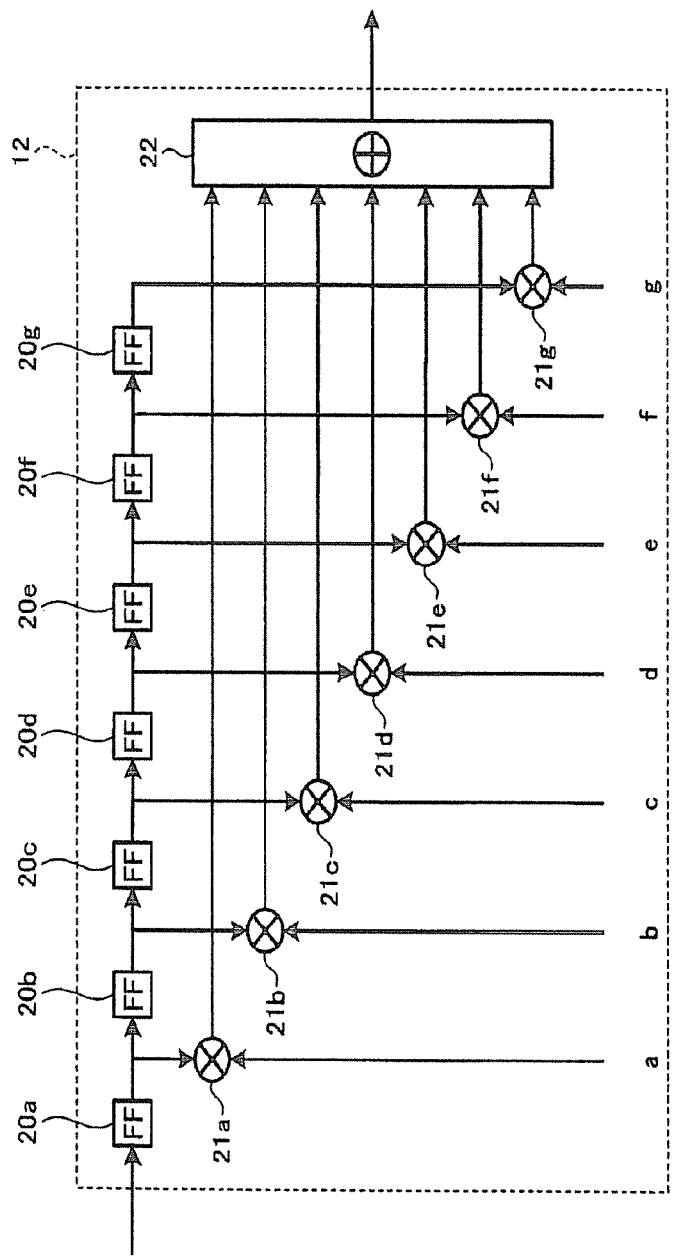
FIG. 13 is a diagram showing a configuration example of an FIR filter according to the third embodiment of the invention.

Here, a configuration of each of the FIR filters will be described with reference to FIG. 13. FIG. 13 is a diagram showing a configuration example of the FIR filter 12. The FIR filter 12 includes flip-flops 20a to 20g, multipliers 21a to 21g, and an adder 22. The flip-flops 20a to 20g hold inputted sample signals. The flip-flops 20a to 20g function as delay flip-flops. The multipliers 21a to 21g each multiply the inputted sample signals by the respective tap coefficients. The adder 22 adds up the values obtained by the respective multipliers 21a to 21g and outputs the added-up value.

When sample signals are inputted to the FIR filter 12, the flip-flops 20a to 20g hold the sample signals. Then, the multipliers 21a to 21g multiple the corresponding held sample signals by the respective values of tap coefficients a to g. The adder 22 adds up all the multiplied results from the multipliers 21a to 21g, and outputs the addition result.

Here, some of the sample signals held in flip-flops 20a to 20g are sample signals obtained at rising edges of the clock of interference origin and largely influenced by interference. Hereinafter, such a sampling signal is referred to as a rising edge sample. The FIR filter 12 outputs an operation result influenced by interference due to such rising edge samples. The decision unit 6b presumes how much the influence is, by tracking the positions of rising edge samples held in each of the FIR filters and monitoring the tap coefficients by which the rising edge samples are multiplied. In the embodiment, the decision unit 6b performs the monitoring, and decides to output the symbol from the FIR filter with the smallest presumed influence of interference.

The FIR filters 13, 14 have the same configuration as the FIR filter 12. The tap coefficients take different values among the FIR filters 12, 13, 14. These values may be retained as a ROM in each of the FIR filters, may be inputted from the outside of the FIR filters, or may be provided in any manner other than these.

Figure 14:
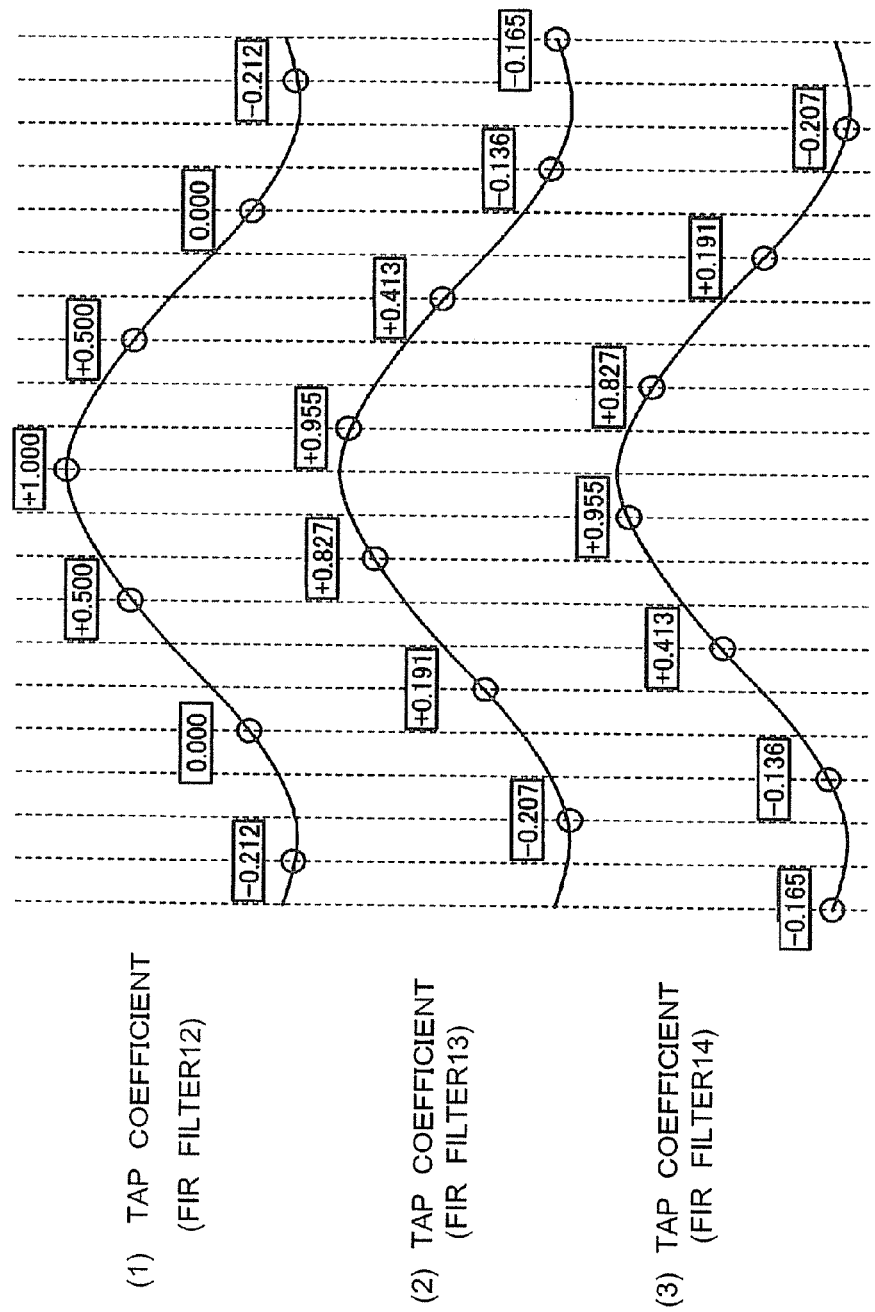
FIG. 14 is a diagram showing tap coefficients of FIR filters according to the third embodiment of the invention.

Next, the tap coefficients of each of the FIR filters will be described with reference to the FIG. 14. FIG. 14 is a diagram showing the tap coefficients of each of the FIR filters. Each of the FIR filters functions as a low-pass filter having a passband of a central 20 MHz band. The tap coefficients of the FIR filter are calculated from a sinc function, or the sinc function to which a roll-off operation is additionally applied to reduce the number of taps. Here, the tap coefficients of each of the FIR filters are values taken out from a waveform shown in FIG. 14 in time points at appropriate intervals. For example, the tap coefficients a to g of the FIR filter 12 are −0.212, 0, +0.5, +1.0, +0.5, 0, −0.212, respectively. The FIR filters 13, 14 each function not only as a low-pass filter but also as an interpolation filter. The tap coefficients of each of the FIR filters 13, 14 can be obtained by taking out values from the same function as the function used for the FIR filter 12 at time points shifted from the corresponding time points for the FIR filter 12 by a period desired to be corrected.

After each of the FIR filters perform the foregoing step S4b, the decision unit 6b detects the rising edge samples ((6) in FIG. 11) from the sampling clock of interference origin in the same manner as the rising edge detection. In this case, from the sample signal obtained by A/D converting the analog signal, almost all the samples largely influenced by the interference are sampled at the timings of the rising edge samples ((7) in FIG. 11)).

Figure 15:
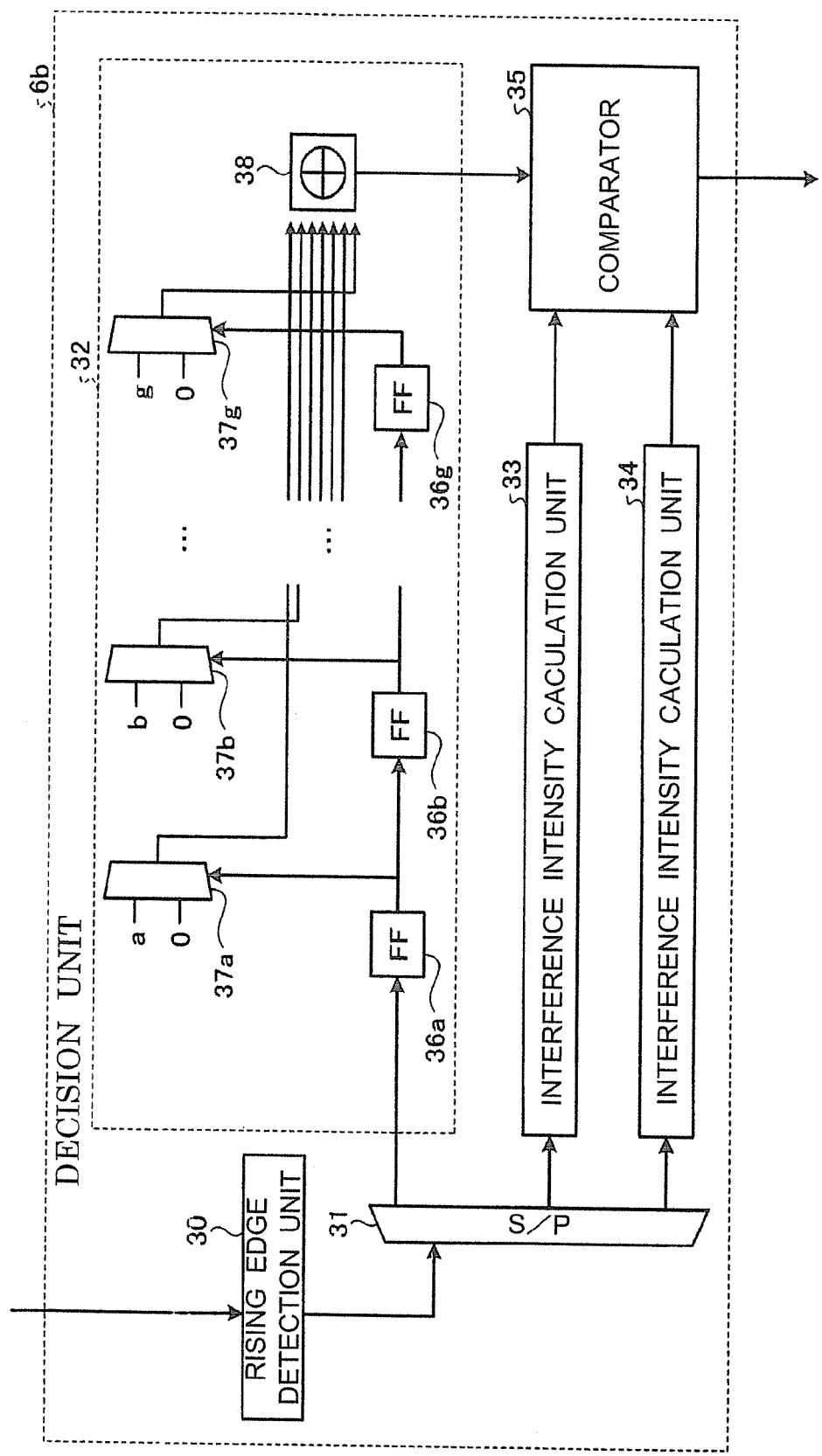
FIG. 15 is a diagram showing a configuration example of a decision unit according to the third embodiment of the invention.

Here, a configuration of the decision unit is described with reference to FIG. 15. FIG. 15 is a diagram showing a configuration example of the decision unit 6b. The decision unit 6b includes a rising edge detection unit 30, an S/P converter 31, an interference intensity calculation unit 32, an interference intensity calculation unit 33, an interference intensity calculation unit 34 and a comparator 35.

The rising edge detection unit 30 detects a rising edge of the sampling clock of interference origin and outputs a rising edge flag upon detection of the rising edge sample. The S/P converter 31 outputs the rising edge flag to each of the interference intensity calculation units. The interference intensity calculation unit 32 calculates the interference intensity of the FIR filter 12. The interference intensity calculation unit 33 calculates the interference intensity of the FIR filter 13. The interference intensity calculation unit 34 calculates the interference intensity of the FIR filter 14. The comparator 35 determines which FIR filter has the smallest influence of interference, and outputs the decision result to the selector 7b.

The interference intensity calculation unit 32 includes flip-flops 36a to 36g, selectors 37a to 37g and an adder 38. The flip-flops 36a to 36g store the rising edge flags outputted by the rising edge detection unit 30. The flip-flops 36a to 36g function as delay flip-flops. The selectors 37a to 37g select values to be outputted, on the basis of the rising edge flag stored in the flip-flops 36a to 36g. The adder 38 adds up the values outputted from the respective selectors 37a to 37g, and outputs the added-up value to the comparator 35.

Tap coefficients a to g outputted by the respective selectors are the same as the tap coefficients a to g included in the FIR filter 12 shown in FIG. 13. Here, the interference intensity calculation unit 33 and the interference intensity calculation unit 34 have the same configuration as the FIR filter 12. The interference intensity calculation unit 33 includes the same tap coefficients as the FIR filter 13, and the interference intensity calculation unit 34 includes the same tap coefficients as the FIR filter 14.

When the decision unit 6b receives the sampling clock of interference origin obtained by sampling the clock of interference origin at 120 MHz, the rising edge detection unit 30 detects a rising edge of the clock on the basis of the inputted sampling clock of interference origin. Upon detection of the rising edge, the rising edge detection unit 30 outputs a rising edge flag to the S/P converter 31. The S/P converter 31 tracks the sample influenced by interference to find out which FIR filter the sample has been outputted by the S/P converter 2b. The S/P converter 31 outputs the rising edge flag to the interference intensity calculation unit corresponding to the found FIR filter.

The interference intensity calculation unit 32 is a circuit to track how many tap coefficients are used to multiply the samples held in the flip-flops 36a to 36g. The interference intensity calculation unit 32 stores rising edge flags, if inputted. The selectors 37a to 37g each check whether or not a rising edge flag is stored in a corresponding one of the flip-flops 36a to 36g. The selectors 37a to 37g each output the tap coefficient when the rising edge is stored (the stored sample is the rising edge sample), whereas the selectors 37a to 37g outputs 0 (zero) when the rising edge is not stored (the stored sample is not the rising edge sample). The adder 38 adds up the absolute values of the values inputted from the respective selectors 37a to 37g. The adder 38 outputs the added-up value to the comparator 35. As a result, the interference intensity calculation unit 32 calculates the interference intensity that is the sum of the absolute values of the tap coefficients which are used to multiply the samples influenced by the interference from among the samples outputted from the FIR filter 12. In the same manner, the interference intensity calculation unit 33 calculates the interference intensity of the FIR filter 13. The interference intensity calculation unit 34 calculates the interference intensity of the FIR filter 14 (step S20). The comparator 35 also receives the added-up values of the interference intensity calculation unit 33 and the interference intensity calculation unit 34.

The comparator 35 compares the values outputted from all the interference intensity calculation units, decides which FIR filter has the smallest value (smallest influence of interference), and outputs the decision result to the selector 7b (step S5b). The selector 7b selects the FIR filter on the basis of the decision result of the decision unit 6b, and outputs the symbol from the selected FIR filter (step S6b).

As has been described, the interference reduction device of the embodiment calculates the interference intensity of each of the FIR filters, and outputs the symbol from the FIR filter having the smallest interference intensity. Thereby, the interference reduction device of the third embodiment is capable of determining the FIR filter having received small influence of interference with higher accuracy than those in the first and second embodiments.

The invention is not limited to the aforementioned embodiments, but may be changed in various manners without departing from the spirit of the invention.

For example, in the first to third embodiments, the interference reduction device is installed in the radio communication apparatus. However, such application is not only the way. The interference reduction device is employable in any of various types of communication apparatus other than the radio communication apparatus.

What is claimed is:

1. An interference reduction device comprising:
    an analog to digital converter (A/D converter: ADC) to perform A/D conversion on input analog signal at frequency twice as high as output frequency;
    a serial to parallel converter (S/P converter) to repeatedly perform a session of distribution processing in which a digital signal obtained by the A/D conversion is distributed on a symbol basis to two destinations in a predetermined order;
    a digital filter to receive the signal distributed at the first timing in each session of the distribution processing and to output the signal after a filter operation at the output frequency;
    an interpolation filter to receive the signal other than the signal distributed at the first timing in each session of the distribution processing, to perform a filter operation, also to perform interpolation processing to thereby generate the signal distributed to the digital filter in the distribution processing, and to output the generated signal at the output frequency;
    a sampling unit to sample the inputted digital signal at frequency twice as high as the output frequency;
    a decision unit to decide which one of the digital filter and the interpolation filter has received smaller influence of interference of the input digital signal, on the basis of a sampling result by the sampling unit; and
    a selector to output one of the signals outputted by the digital filter and the interpolation filter, on the basis of a decision result of the decision unit.

2. The interference reduction device according to claim 1, wherein
    the decision unit decides that the interpolation filter has received smaller influence of interference when an output timing of the digital filter and the interpolation filter is coincident with any of the timings of a rising edge, a falling edge, or both rising and falling edges of the signal sampled by the sampling unit, and decides that the digital filter has smaller influence of interference when the output timing is different from the edge timing.

3. The interference reduction device according to claim 1, wherein
    in a case where the input analog signal receives maximum interference at least one of edge timings of a rising edge, a falling edge, and both rising and falling edges of the input digital signal, and where an intensity of the interference decreases over time,
    the decision unit detects any of the timings of the rising edge, the falling edge, or both rising and falling edges of the signal sampled by the sampling unit,
        assigns intensity numbers to signals sampled immediately before and after the detected timing in such a manner as to assign 1 to the signal sampled immediately before the detected timing and 2 to the signal sampled immediately after the detected timing,
        assigns an intensity number to each of signals subsequent to the signal assigned the intensity number 2, the intensity number incremented by 1 from the intensity number assigned to the preceding signal,
        divides the signals assigned the intensity numbers into units of output intervals of the digital filter and the interpolation filter,
        detects the signal having the largest intensity number for each of the output intervals, and
        decides which filter has received smaller influence of interference, on the basis of the detected signal.

4. The interference reduction device according to claim 1, wherein
    the digital filter and the interpolation filter are FIR filters.

5. The interference reduction device according to claim 4, wherein
    the decision unit includes:
        a serial to parallel converter to repeatedly perform a session of sampling signal distribution processing in which a signal sampled by the sampling unit is distributed to two destinations in a predetermined order;
        two interference intensity calculation units to receive the signal distributed by the serial-to-parallel converter, and calculate interference intensities of the digital filter and the interpolation filter, respectively, on the basis of the inputted signal and tap coefficients used in the digital filter and the interpolation filter; and
        a comparator to compare the interference intensities respectively calculated by the two interference intensity calculation units, and
    the decision unit decides which filter has received smaller influence of interference, on the basis of a comparison result of the comparator.

6. The interference reduction device according to claim 1, wherein
    the interference reduction device is installed in a communication apparatus.

7. The interference reduction device according to claim 1, wherein
    the sampling unit is a flip-flop.

8. An interference reduction device comprising:
    an analog to digital converter (A/D converter: ADC) to perform A/D conversion on input analog signal at frequency M (M is an integer of 3 or more) times as high as output frequency;

a serial to parallel converter (S/P converter) to repeatedly perform a session of distribution processing in which a digital signal obtained by the A/D conversion is distributed on a symbol basis to M destinations in a predetermined order;

a digital filter to receive the signal distributed at the first timing in each session of the distribution processing and to output the signal after a filter operation at the output frequency;

(M−1) interpolation filters each to receive the signal other than the signal distributed at the first timing in each session of the distribution processing, to perform a filter operation, also to perform interpolation processing to thereby generate the signal distributed to the digital filter in the distribution processing, and to output the generated signal at the output frequency;

a sampling unit to sample the inputted digital signal at frequency M times as high as the output frequency;

a decision unit to decide which one of the digital filter and the (M−1) interpolation filters has the smallest influence of interference of the input digital signal, on the basis of a sampling result by the sampling unit; and a selector to output one of the signals outputted by the digital filter and the (M−1) interpolation filters, on the basis of a decision result of the decision unit.

9. The interference reduction device according to claim 8, wherein in a case where the input analog signal receives maximum interference at least one of edge timings of a rising edge, a falling edge, and both rising and falling edges of the input digital signal, and where an intensity of the interference decreases over time, the decision unit detects any of the timings of a rising edge, a falling edge, or both rising and falling edges of the signal sampled by the sampling unit, assigns intensity numbers to signals sampled immediately before and after the detected timing in such a manner as to assign 1 to the signal sampled immediately before the detected timing and 2 to the signal sampled immediately after the detected timing, a assigns an intensity number to each of signals subsequent to the signal assigned the intensity number 2, the intensity number incremented by 1 from the intensity number assigned to the preceding signal, divides the signals assigned the intensity numbers into units of output intervals of the digital filter and the (M−1) interpolation filters, detects the signal having the largest intensity number for each of the output intervals, and decides which filter has received smallest influence of interference, on the basis of the detected signal.

10. The interference reduction device according to claim 8, wherein the digital filter and the (M−1) interpolation filters are FIR filters.

11. The interference reduction device according to claim 10, wherein the decision unit includes:

a serial to parallel converter to repeatedly perform a session of sampling signal distribution processing in which a signal sampled by the sampling unit is distributed to M destinations in a predetermined order;

M interference intensity calculation units to receive the signal distributed by the serial-to-parallel converter, and calculate interference intensities of the digital filter and the (M−1) interpolation filters, respectively, on the basis of the inputted signal and tap coefficients used in the digital filter and the (M−1) interpolation filters; and a comparator to compare the interference intensities respectively calculated by the M interference intensity calculation units, and the decision unit decides which filter has received the smallest influence of interference, on the basis of a comparison result of the comparator.

12. The interference reduction device according to claim 8, wherein the sampling unit is a flip-flop.

13. The interference reduction device according to claim 8, wherein the interference reduction device is installed in a communication apparatus.

14. An interference reduction device comprising:

an analog to digital converter (A/D converter: ADC) to perform A/D conversion on input analog signal at frequency M (M is an integer of 3 or more) times as high as output frequency;

a serial to parallel converter (S/P converter) to repeatedly perform a session of distribution processing in which a digital signal obtained by the A/D conversion is distributed on a symbol basis to M destinations in a predetermined order;

a buffer to receive the signal distributed at the first timing in each session of the distribution processing and to output the symbols in a first-in first-out order;

(M−1) interpolation filters each to receive the signal other than the signal distributed at the first timing in each session of the distribution processing, to perform a filter operation, also to perform interpolation processing to thereby generate the signal distributed to the buffer in the distribution processing, and to output the generated signal at the output frequency;

a sampling unit to sample the inputted digital signal at frequency M times as high as the output frequency;

a decision unit to decide which one of the buffer and the (M−1) interpolation filters has received the smallest influence of interference of the input digital signal, on the basis of a sampling result by the sampling unit; and a selector to output one of the signals outputted by the buffer and the (M−1) interpolation filters, on the basis of a decision result of the decision unit.

15. The interference reduction device according to claim 14, wherein the buffer is a FIFO memory.

16. The interference reduction device according to claim 14, wherein the interference reduction device is installed in a communication apparatus.

* * * * *